United States Patent [19]

Tsunekawa

[11] Patent Number: 4,639,924
[45] Date of Patent: Jan. 27, 1987

[54] DRIVE SYSTEM FOR A SEMICONDUCTOR LASER

[75] Inventor: Tokuichi Tsunekawa, Yokohama, Japan

[73] Assignee: Canon Kabushiki Kaisha, Tokyo, Japan

[21] Appl. No.: 525,174

[22] Filed: Aug. 22, 1983

[30] Foreign Application Priority Data

| Sep. 3, 1982 [JP] | Japan | 57-154131 |
| Sep. 3, 1982 [JP] | Japan | 57-154132 |
| Apr. 7, 1983 [JP] | Japan | 58-61452 |
| Apr. 7, 1983 [JP] | Japan | 58-61453 |

[51] Int. Cl.⁴ .............................................. H01S 3/13
[52] U.S. Cl. ...................................... 372/33; 372/29; 372/34; 372/38
[58] Field of Search ...................... 372/26, 34, 38, 29, 372/33; 307/311

[56] References Cited

U.S. PATENT DOCUMENTS

| 4,237,427 | 12/1980 | Holland | 372/26 |
| 4,484,331 | 11/1984 | Miller | 372/34 |

FOREIGN PATENT DOCUMENTS

| 0050679 | 4/1980 | Japan | 372/29 |
| 0104486 | 8/1981 | Japan | 372/29 |

Primary Examiner—James W. Davie
Attorney, Agent, or Firm—Fitzpatrick, Cella, Harper & Scinto

[57] ABSTRACT

A transistor is connected between one terminal of a semiconductor laser and a power supply, a control terminal of the transistor is connected to an output terminal of an amplifier, a voltage is applied to one input terminal of the amplifier, and a junction of the semiconductor laser and a resistor is connected to the other input terminal of the amplifier.

5 Claims, 14 Drawing Figures

DRIVE SYSTEM FOR A SEMICONDUCTOR LASER

BACKGROUND OF THE INVENTION

1. Field of the Invention

The present invention relates to a drive system for a semiconductor laser having a stabilized output.

2. Description of the Prior Art

Figure 1:
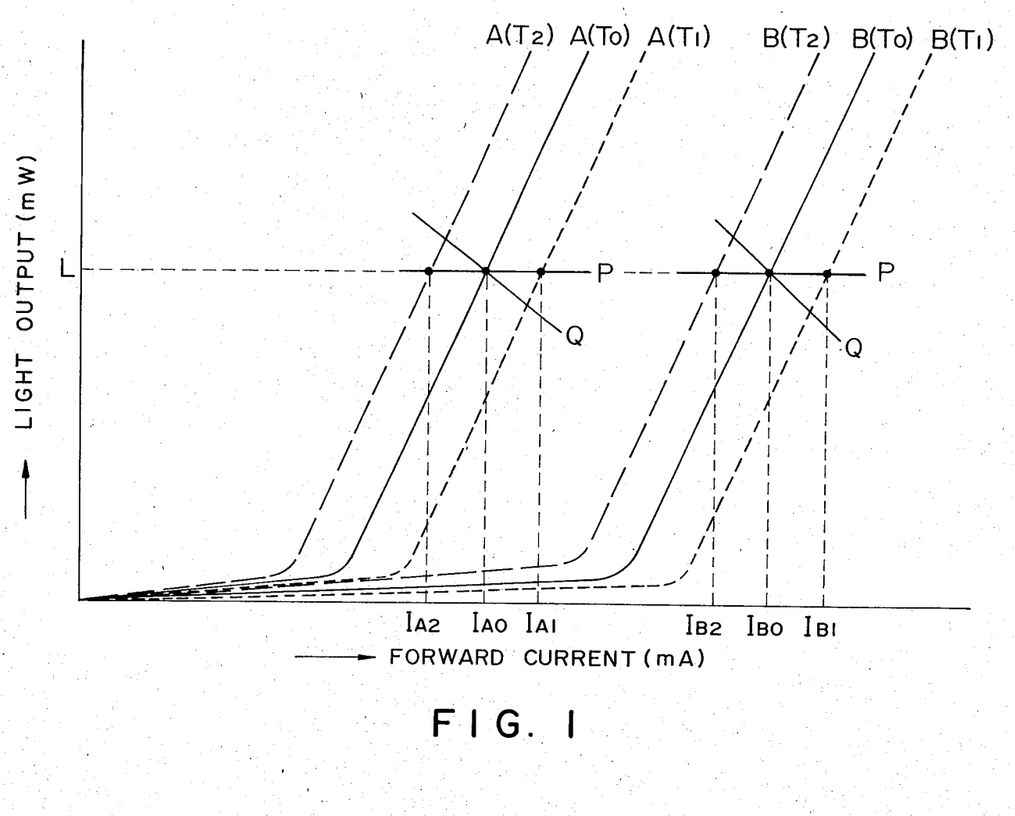
FIG. 1 shows a forward current versus light output characteristic of a semiconductor laser.

A forward current versus light output characteristic of a semiconductor laser at room temperature varies depending on process parameters in the manufacture as shown by $A(T_0)$ or $B(T_0)$ in FIG. 1. Only those semiconductor lasers having variations within a permissible range are selected as those which meet specification.

As the surrounding temperature rises above the room temperature, the forward current versus light output characteristic of the semiconductor laser shifts to the right as shown by $A(T_1)$ or $B(T_1)$, and as the temperature falls below the room temperature, the surrounding characteristic shifts to the left as shown by $A(T_2)$ or $B(T_2)$. The amount of shift of the temperature characteristic due to the change of the surrounding temperature depends on the structure of the semiconductor laser.

Further, a forward voltage VF of the semiconductor laser changes with the temperature such that it decreases with the increase of the surrounding temperature.

Such a semiconductor laser has been used in expensive equipment such as a light communication apparatus or a laser beam printer. Such equipment has a strict specification for an input/output characteristic and must be used at a fixed temperature.

Recently, it has been desired to use semiconductor laser in not only the expensive equipment but also inexpensive portable devices such as cameras.

However, the power supply of the inexpensive device such as a camera usually varies in a range of 5-7 volts and is used in circumstances of a large temperature difference such as inside and outside. Accordingly, it has been difficult to use the semiconductor laser in inexpensive portable devices.

SUMMARY OF THE INVENTION

It is an object of the present invention to provide a drive system for a semiconductor laser having an output thereof stabilized by a temperature compensation circuit.

It is another object of the present invention to provide a drive system for a semiconductor laser which prevents harm to a human body by the laser used for range finding at any temperature condition.

The other objects of the present invention will be apparent from the following description of the preferred embodiments of the present invention.

DETAILED DESCRIPTION OF THE PREFERRED EMBODIMENTS

Figure 2:
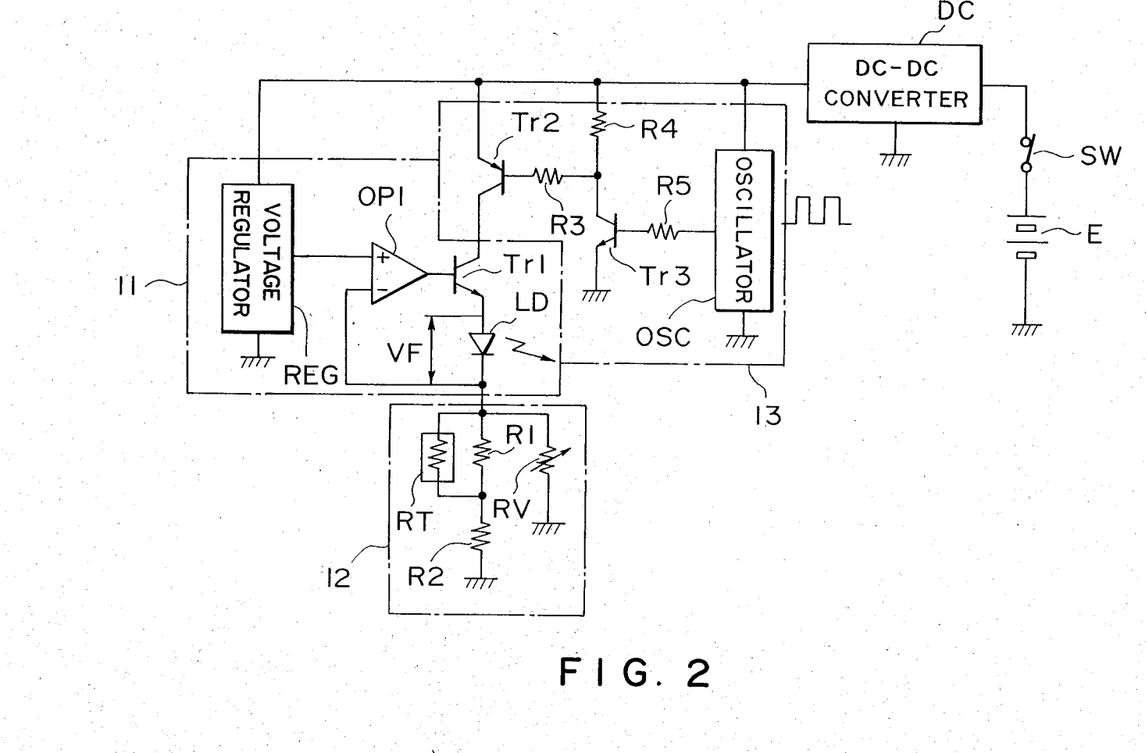
FIG. 2 shows a drive circuit for the semiconductor laser in accordance with one embodiment of the present invention.

Referring to FIG. 2, E denotes a power supply battery, SW denotes a power switch, DC denotes a step-up DC-DC converter, and numeral 11 denotes a circuit for eliminating the variation of a power supply voltage and the variation of a forward voltage of a semiconductor laser due to a change of temperature. The circuit 11 is connected to the power supply E through the converter DC and the power switch SW. The circuit 11 comprises a regulated power supply REG, an operational amplifier $OP_1$, a transistor $Tr_1$ and a semiconductor laser LD. A reference voltage $V_K$ from the regulated power supply REG is applied to the non-inverting input terminal of the operational amplifier $OP_1$ and an output terminal thereof is connected to a base of a transistor $Tr_1$. The anode of semiconductor laser LD is connected to the emitter of the transistor $Tr_1$ and the cathode of semiconductor laser LD is connected to the inverting input terminal of the operational amplifier $OP_1$. Numeral 12 denotes the circuit for compensating for a change of the surrounding temperature and a variation of the input-/output characteristic. The circuit 12 comprises a thermistor RT, resistors $R_1$ and $R_2$ and a potentiometer RV, and the resistors $R_1$ and $R_2$ are connected in series to the cathode of the semiconductor laser LD. The thermistor RT is connected in parallel to the resistor $R_1$, and the potentiometer RV is connected in parallel to the resistors $R_1$ and $R_2$. Numeral 13 denotes a circuit for modulating the output of the semiconductor laser LD. The circuit 13 is connected to the power supply E through the converter DC and the power switch SW. The circuit 13 comprises transistors $Tr_2$ and $Tr_3$, resistors $R_3$, $R_4$ and $R_5$ and an oscillator OSC, and the output terminal of the oscillator OSC is connected to the base of the transistor $Tr_3$ through the resistor $R_5$. An emitter of the transistor $Tr_3$ is grounded and the collector thereof is connected to the converter DC through the resistor $R_4$. The collector of the transistor $Tr_3$ is also connected to the base of the transistor $Tr_2$ through the resistor $R_3$, the emitter of the transistor $Tr_2$ is connected to the converter DC and the collector thereof is connected to the collector of the transistor $Tr_1$.

The operation of the above circuit is now explained. When the power switch SW is closed, the power supply voltage stepped up by the converter DC is applied to the respective circuits. As a result, an oscillation pulse of the oscillator OSC is applied to the base of the transistor $Tr_3$, which is turned on and off by the oscillation pulse. The transistor $Tr_2$ is turned on and off in synchronism with the turn-on and turn-off of the transistor $Tr_3$. As a result, the semiconductor laser LD is energized to emit a light when the transistor $Tr_2$ is turned on. The light output of the semiconductor laser LD is controlled in the following manner.

The reference voltage $V_K$ of the regulated power supply REG is applied to the non-inverting input terminal of the operational amplifier $OP_1$ and a potential at the junction of the semiconductor laser LD and the circuit 12 which includes the compensation resistors is fed back to the inverting input terminal of the operational amplifier $OP_1$. Therefore, the potential at the junction of the semiconductor laser LD and the circuit 12 is fixed to the voltage $V_K$.

As a result, the forward current of the semiconductor laser LD is defined by the current flowing through the compensation resistors of the circuit 12. For example, the forward current $I_{A0}$ of the semiconductor laser LD is given by $$I_{A0} = \frac{V_K}{R(T_0)} + \frac{V_K}{RV}$$

where $R(T_0)$ is a resistance of the temperature compensation resistors comprising the thermistor RT and the resistors $R_1$ and $R_2$ when the surrounding temperature is $T_0$.

In order to stabilize the light output of the semiconductor laser LD to L shown in FIG. 1 when the surrounding temperature changes to $T_1$ and $T_2$, the resistance of the temperature compensation resistors may be changed such that the forward current of the semiconductor laser LD changes to $I_{A1}$ and $I_{A2}$.

When the input/output characteristic of the semiconductor laser LD includes a variation, the potentiometer RV is adjusted such that the level of the forward current is shifted from $I_{A0}$ to $I_{B0}$, for example.

When it is desired to correct the variation of the light output characteristic of the semiconductor laser due to the change of temperature to Q shown in FIG. 1, a corresponding forward current flows through the temperature compensation resistors.

Figure 3:
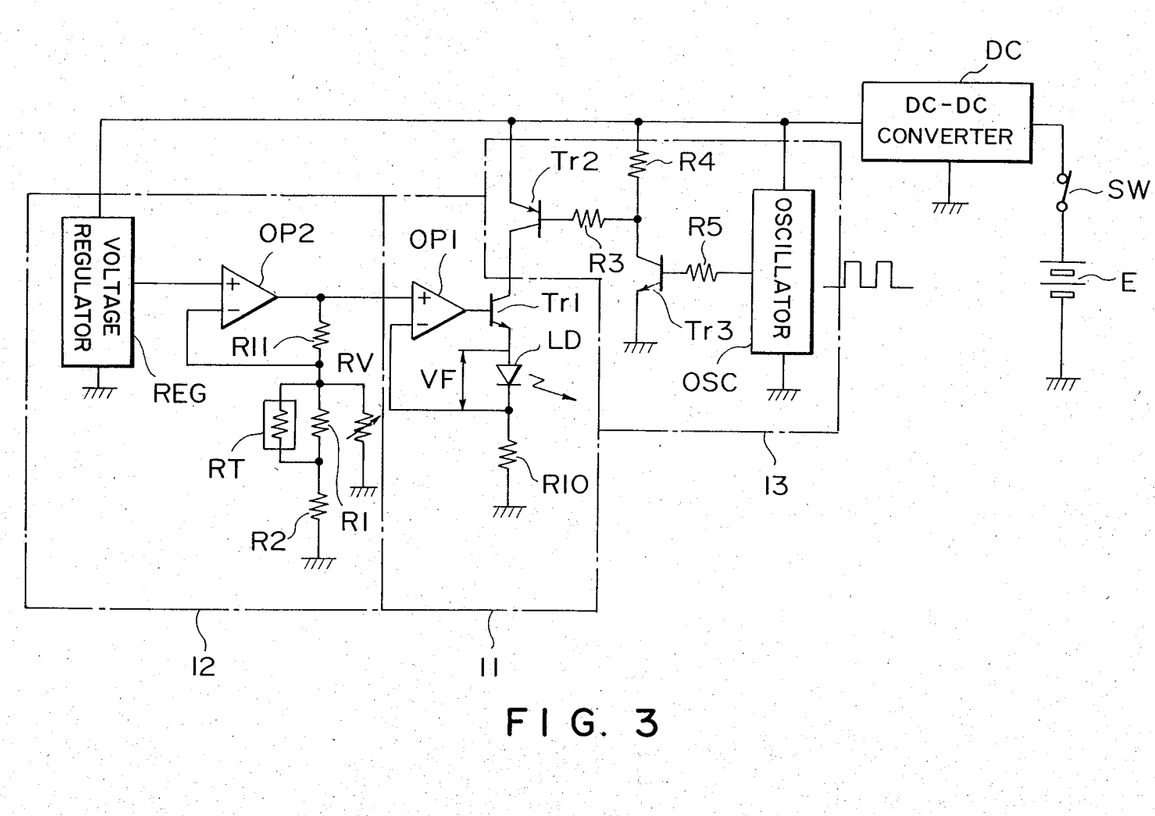
FIG. 3 shows a drive circuit for the semiconductor laser in accordance with another embodiment of the present invention.

FIG. 3 shows another embodiment of the present invention, in which the like elements to those shown in FIG. 2 are designated by the like numerals and the explanation thereof is omitted.

Numeral 11 denotes a circuit for eliminating the variation of the power supply voltage and the variation of the forward voltage of the semiconductor laser due to a change of temperature, and numeral 12 denotes a compensation circuit for compensating for the variation of the surrounding temperature and the variation of the input/output characteristic.

The reference voltage $V_K$ from the regulated power supply REG is applied to a non-inverting input terminal of an operational amplifier $OP_2$ and an output terminal thereof is connected to the non-inverting input terminal of the operational amplifier $OP_1$. A resistor $R_{11}$ is connected between the output terminal of the operational amplifier $OP_2$ and the inverting input terminal thereof. The resistor $R_{11}$ is grounded through a series connection of the resistors $R_1$ and $R_2$. The thermistor RT is connected in parallel to the resistor $R_1$ and the potentiometer RV is connected in parallel to the resistors $R_1$ and $R_2$. The resistors $R_1$, $R_2$ and RV and the thermistor RT from the temperature compensation resistors. The cathode of the semiconductor laser LD is connected to the non-inverting input terminal of the operational amplifier $OP_1$. The cathode of the semiconductor laser LD is also grounded through a forward current limiting resistor $R_{10}$.

The operation of the above circuit is now explained. When the power switch SW is closed, the power supply voltage stepped up by the converter DC is applied to the respective circuits. As a result, the oscillation pulse of the oscillator OSC is applied to the base of the transistor $Tr_3$, which is turned on and off in accordance with the oscillation pulse. The transistor $Tr_2$ is turned on and off in synchronism with the turn-on and turn-off of the transistor $Tr_3$. As a result, the semiconductor laser LD is energized to emit a light when the transistor $Tr_2$ is turned on. The light output of the semiconductor laser LD is controlled in the following manner.

The reference voltage $V_K$ of the regulated power supply is applied to the non-inverting input terminal of the operational amplifier $OP_2$, and the potentional at the junction of the resistor $R_{11}$ and the compensation resistors $R_1$, $R_2$, RV and RT is fed back to the inverting input terminal of the operational amplifier OP2. Therefore, the potential at the junction is fixed to the voltage $V_K$.

As a result, the output of the operational amplifier $OP_2$ is defined by the current flowing through the compensation resistors, through the resistor $R_{11}$, and the compensated output voltage of the operational amplifier OP2 is applied to the inverting input terminal of the operational amplifier $OP_1$.

The output $V_{OP2}$ of the operational amplifier $OP_2$ is given by $$V_{OP2} = \left(1 + \frac{R_{11}}{R(T_0)} + \frac{R_{11}}{RV}\right) V_K$$

where $R(T_0)$ is the resistance of the temperature compensation resistors comprising the thermistor RT and the resistors $R_1$ and $R_2$ when the surrounding temperature is $T_0$. Thus, the forward current $I_{A0}$ of the semiconductor laser is defined by $$I_{A0} = \frac{V_{OP2}}{R_{10}} = \left(1 + \frac{R_{11}}{R(T_0)} + \frac{R_{11}}{RV}\right) \frac{V_K}{R_{10}}$$

For example, in order to stabilize the light output of the semiconductor laser LD to L shown in FIG. 1 when the surrounding temperature changes to $T_1$ and $T_2$, the resistance of the temperature compensation resistors is changed such that the forward current of the semiconductor laser LD changes to $I_{A1}$ and $I_{A2}$.

When the input/output characteristic of the semiconductor laser includes a variation, the potentiometer RV is adjusted such that the level of the forward current is shifted from $I_{A0}$ to $I_{B0}$.

When it is desired to correct the variation of the light output characteristic of the semiconductor laser due to the change of temperature to Q shown in FIG. 1, the corresponding forward current flows through the temperature compensation resistors.

Figure 4A:
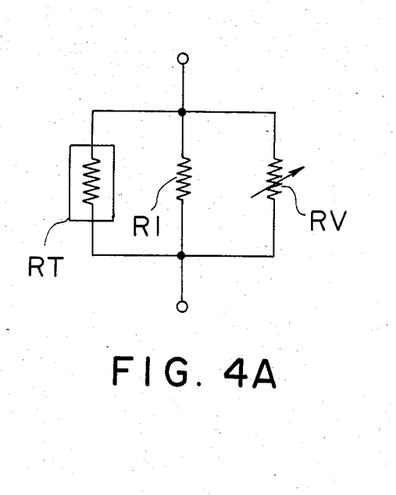
FIGS. 4A, 4B and 4C show modifications of compensation resistors of FIGS. 2 and 3.
Figure 4B:
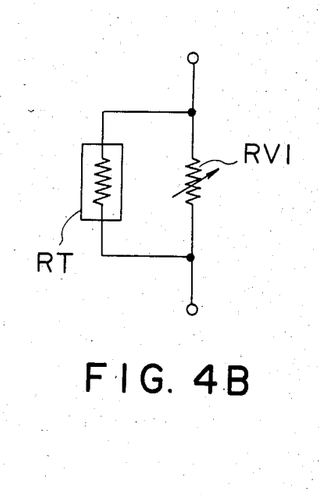
Figure 4C:
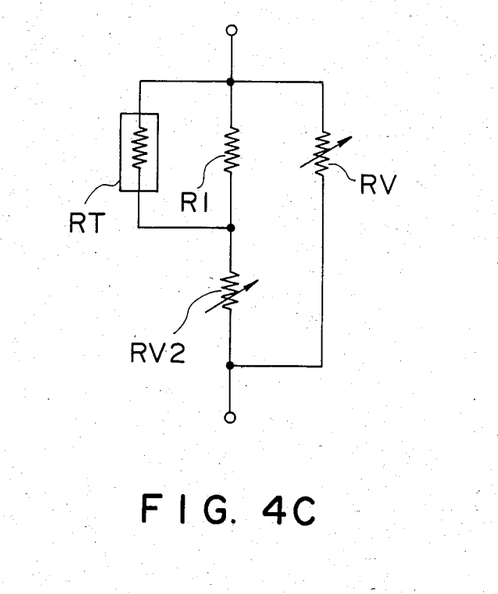

The connections of the temperature compensation resistors of the circuit 12 have been shown in FIGS. 2 and 3. The present invention is not limited thereto but connections shown in FIGS. 4A, 4B and 4C may be used. In FIG. 4A, the resistor $R_2$ in FIGS. 2 and 3 is omitted, in FIG. 4B, the resistor $R_2$ in FIGS. 2 and 3 is omitted and the resistor $R_1$ and the potentiometer RV are replaced by a potentiometer $RV_1$, and in FIG. 4C, the resistor $R_2$ in FIGS. 2 and 3 is replaced by a potentiometer to further compensate the input/output characteristic of the semiconductor laser.

As described hereinabove, in accordance with the present invention, even if the input/output characteristic of the semiconductor laser includes the variation or even if the surrounding temperature or the power supply voltage varies, the influence thereby is eliminated and a desired light output is always produced. Thus, the present invention makes it possible to use the semiconductor laser in inexpensive portable equipment.

Figure 5:
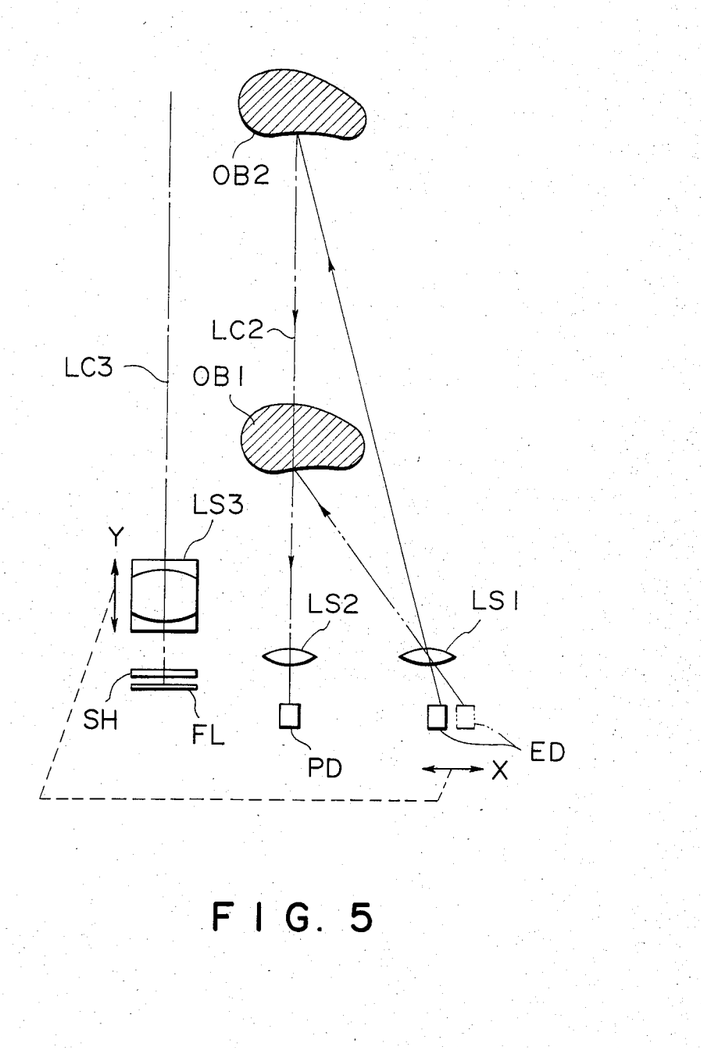
FIG. 5 shows a principle of a range finder, FIG. 6 composed of FIGS. 6A and 6B shows a circuit diagram in which the drive circuit for the semiconductor laser shown in FIGS. 2 or 3 is used in the range finder of FIG. 5.

FIG. 5 illustrates a principle of a range finder. ED denotes an illumination light source such as a light emitting diode which is modulated by a modulation circuit (not shown) to emit an intermittent light. The light source ED is positioned at a solid line position in FIG. 5 at an initial state and moved to the right (along an X-axis). $LS_1$ denotes a projection lens for projecting the light from the light source ED to an object. Since the light source ED is moved along the X-axis, the light from the light source ED scans the object positioned on an optical axis $LC_2$ of a focusing lens $LS_2$ from a distant point to a near point. PD denotes a photo-sensor which receives a light reflected by the object through the focusing lens $LS_2$. An output of the photo-sensor PD is detected by a known processing circuit, not shown, which detects a time point at which the photo-sensor PD produces a maximum output as the light source ED is moved. $LS_3$ denotes a photographing lens which is moved along an optical axis $LC_3$ as the light source ED is moved along the X-axis, that is, as the light scans along an optical axis $LC_2$. SH denotes a shutter which is actuated when the output of the photo-sensor is maximum. FL denotes a film.

Assuming now that the object is at a position $OB_2$, the light from the light source ED illuminates the object $OB_2$ when the light source ED is at the solid line position. Thus, the output of the photosensor PD is maximum at this state and the output signal causes a photographing lens drive source (not shown) to be turned off. As a result, the position of the photographing lens $LS_3$ is set in accordance with the position of the object $OB_2$. When the object is at a position $OB_1$, the light from the light source ED illuminates the object $OB_1$ when the light source ED is moved to a chain line position along the X-axis and the photo-sensor PD produces a maximum output at this state. The output signal causes the photographing lens driving source to be turned off and the movement of the photographing lens $LS_3$ along the Y-axis is also stopped. Thus, the position of the photographing lens $LS_3$ is set in accordance with the position of the object $OB_1$. The shutter SH is actuated at the set position and the object is photographed on the film FL.

However, since the intensity of the light of the light source ED such as light emitting diode is weak, a range finding limit is very small, 10 meters at most. In order to measure a long distance with a high precision, a highly directional and high power light source is required and a laser beam is used for that purpose. The lasers include gas lasers and various other lasers but a small and light laser such as a semiconductor laser is preferable for use in portable equipment such as a camera.

However, when an object is one or more human beings, a light above a permissible level may be illuminated causing harm to the human body if a drive circuit does not operate normally, because the intensity of the semiconductor laser beam is high.

Figures 6, 6A:
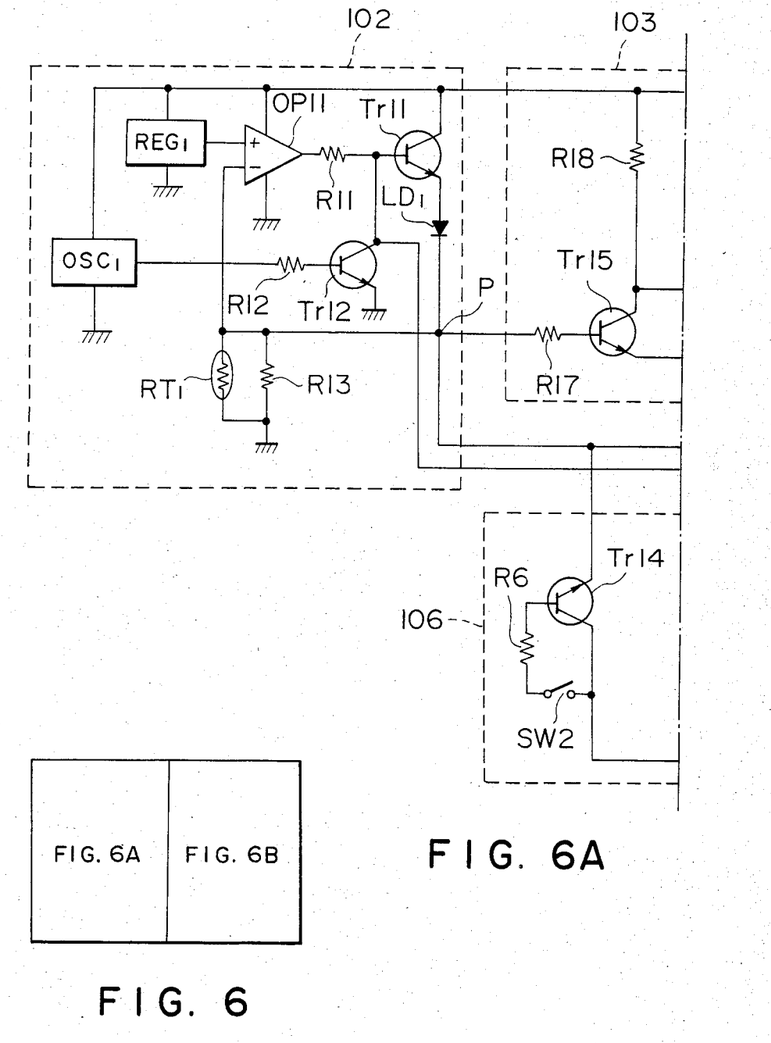
Figure 6B:
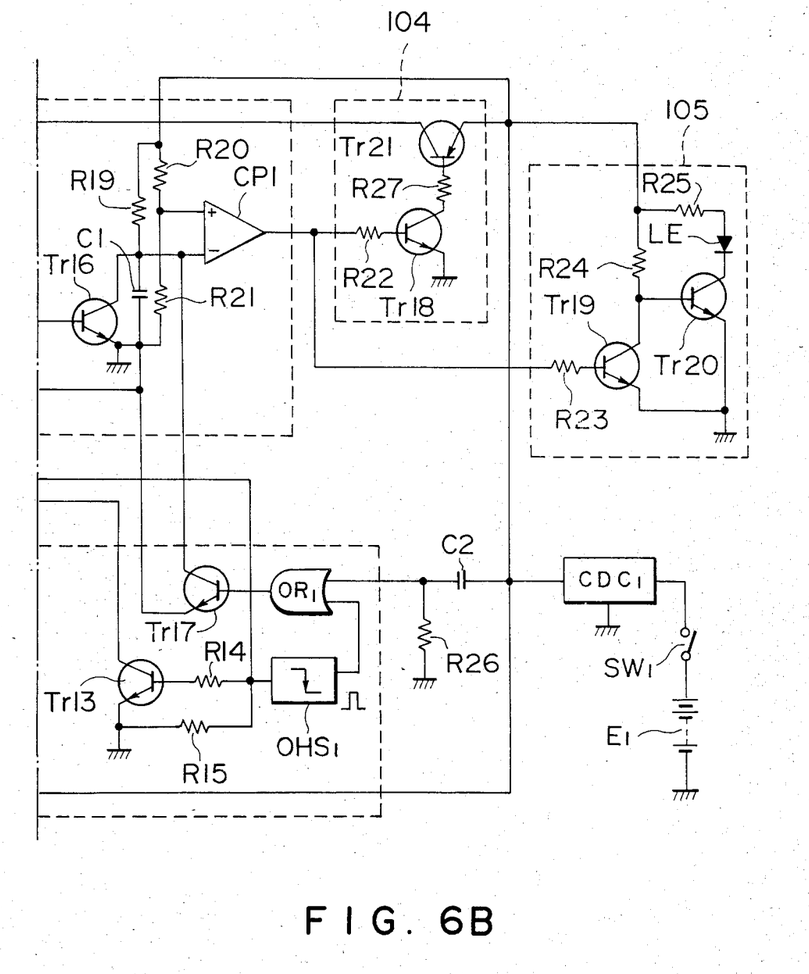

FIG. 6 shows a control circuit for a drive circuit shown in FIG. 5 which uses a semiconductor laser. Numeral 102 denotes a laser modulator which comprises a regulated power supply $REG_1$, an oscillator $OSC_1$, an operational amplifier $OP_{11}$, transistors $Tr_{11}$ and $Tr_{12}$, resistors $R_{11}$, $R_{12}$ and $R_{13}$, a thermistor $RT_1$ and laser diode $LD_1$. Numeral 103 denotes a circuit for detecting modulation, which comprises transistors $Tr_{15}$ and $Tr_{16}$, resistors $R_{17}$, $R_{18}$, $R_{19}$, $R_{20}$ and $R_{21}$, a capacitor $C_1$ and a comparator $CP_1$ Numeral 104 denotes a circuit for controlling a drive power source, which comprises transistors $Tr_{18}$ and $Tr_{21}$ and resistors $R_{22}$ and $R_{27}$. Numeral 105 denotes an alarm circuit which comprises transistors $Tr_{19}$ and $Tr_{20}$, resistors $R_{23}$, $R_{24}$ and $R_{25}$ and a light emitting diode LE. Numeral 106 denotes a circuit for checking if the modulation detection circuit 103 is operating normally or not, which comprises a test switch SW2, transistors $Tr_{13}$, $Tr_{14}$ and $Tr_{17}$, an OR gate $OR_1$ and a one-shot $OHS_1$. A DC power supply $E_1$, a main switch SW1 and a DC-DC converter $CDC_1$ supply powers to the above circuits. A circuit comprising a capacitor $C_2$, a resistor $R_{26}$, an OR gate $OR_1$ and a transistor $Tr_{17}$ initially clears the capacitor $C_1$ when the main switch SW1 is turned on.

Figure 7:
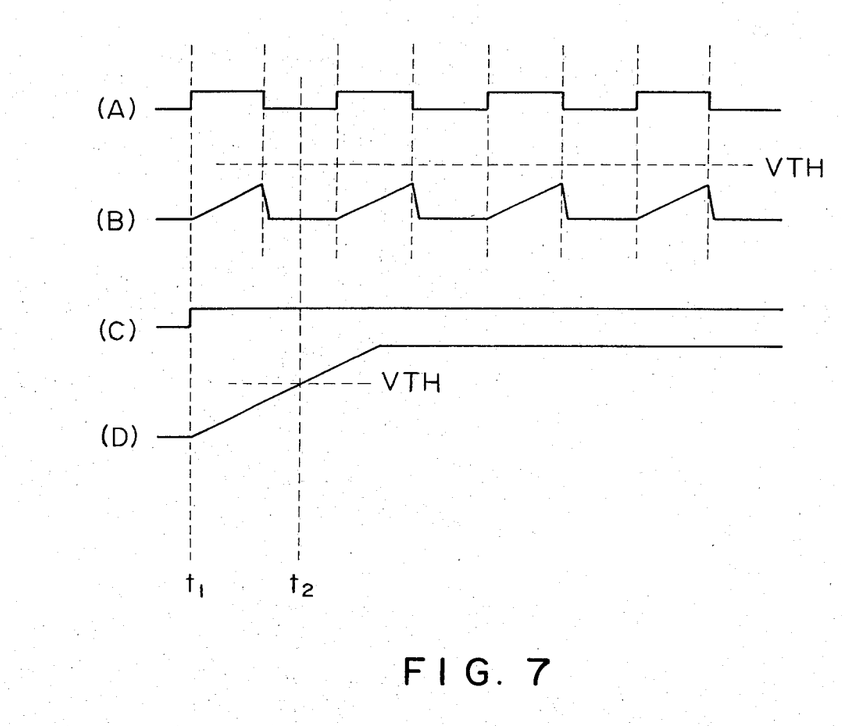
FIG. 7 shows a timing chart for FIG. 6, and FIG. 8 composed of FIGS. 8A and 8B shows a circuit diagram of a modification of FIG. 6.

FIG. 7 shows a timing chart for main portions of FIG. 6.

The operation of the circuit of FIG. 6 is now explained with reference to FIG. 7.

In the modulator 102, a constant voltage from the regulated power supply $REG_1$ is applied to a non-inverting input terminal of the operational amplifier $OP_{11}$, and a feedback circuit comprising the resistor $R_{11}$, the transistor $Tr_{11}$ and the laser diode $LD_1$ is connected between an inverting input terminal of the operational amplifier $OP_{11}$ and an output terminal amplifier $OP_{11}$ and an output terminal thereof. Thus, the potenials at the input terminals are substantially equal and a current of the laser diode $LD_1$ is controlled by a combined resistance of the resistor $R_{13}$ and the temperature compensation thermistor $RT_1$. The conduction of the transistor $Tr_{11}$ is controlled by the oscillator $OSC_1$, the resistor $R_{12}$ and the transistor $Tr_{12}$ to modulate the output of the laser diode $LD_1$. The laser diode $LD_1$ thus intermittently emits a light in synchronism with an oscillation pulse of the oscillator $OSC_1$. So long as the modulator 102 including the transistor $Tr_{11}$ operates normally, a potential at a junction P of the laser diode $LD_1$ and the resistor $R_{13}$ assumes a waveform shown in FIG. 7(A). When the waveform (A) is at a high level, the laser diode $LD_1$ emits the light and the transistor $Tr_{15}$ of the modulation detection circuit 103 is turned on and the transistor $Tr_{16}$ is turned on and the transistor $Tr_{16}$ is turned off. Thus, the time integration capacitor $C_1$ is charged through the resistor $R_{19}$ with a waveform shown in FIG. 7(B). When the waveform (A) is at a low level, the laser diode $LD_1$ does not emit light and the transistor $Tr_{15}$ is turned off and the transistor $Tr_{16}$ is turned on. Thus, the capacitor $C_1$ is discharged with the waveform shown in FIG. 7(B) and the voltage across the capacitor $C_1$ does not reach a threshold voltage VTH determined by the resistors $R_{20}$ and $R_{21}$. Accordingly, the output of the comparator $CP_1$ remains high. Thus, the transistors $Tr_{18}$ and $Tr_{21}$ of the drive power source control circuit 104 are on to maintain the power to drive the laser diode $LD_1$.

FIG. 7(C) shows a waveform at the junction P of the laser diode $LD_1$ and the resistor $R_{13}$ when the modulator does not operate normally at a time $t_1$ and laser diode $LD_1$ continuously emits the light. The capacitor $C_1$ is thus charged with a waveform shown in FIG. 7(D) and the voltage across the capacitor $C_1$ exceeds the threshold voltage VTH determined by the resistors $R_{20}$ and $R_{21}$ at a time $t_2$. As a result, the output of the comparator $CP_1$ changes to a low level and the transistors $Tr_{18}$ and $Tr_{21}$ are turned off. Accordingly, the power to the laser diode $LD_1$ is blocked and the inadvertent continuous light emission is prevented.

The alarm circuit 105 is also activated by the output of the comparator $CP_1$. When the input voltage to the comparator $CP_1$ is lower than the threshold voltage VTH, the output of the comparator $CP_1$ is high and the transistor $Tr_{19}$ is on and the transistor $Tr_{20}$ is off. Accordingly, the light emitting diode LE does not emit the light. At the time $t_2$, if the input voltage exceeds the threshold voltage VTH, the output of the comparator $CP_1$ changes to the low level and the transistor $Tr_{19}$ is turned off and the transistor $Tr_{20}$ is turned on. Thus, the light emitting diode LE emits the light to issue an alarm.

In the circuit 106 which checks if the modulation detection circuit 103 operates normally or not, when the normally open test switch SW2 is depressed, the transistors $Tr_{13}$ and $Tr_{14}$ are turned on and the transistor $Tr_{11}$ is turned off so that the current supply to the laser diode LD is blocked. Instead, the same amount of current flows from the junction P to the resistor $R_{13}$ and the thermistor RT through the transistor $Tr_{14}$. The transistor $Tr_{15}$ of the circuit 103 is turned on by the signal at the junction P and the transistor $Tr_{16}$ is turned off. Thus, the voltage across the capacitor $C_1$ rises and exceeds the threshold voltage VTH after a predetermined time period. As a result, the output of the comparator $CP_1$ changes to the low level. Thus, the light emitting diode LE which is an alarm device of the circuit 105 emits the light to indicate that modulation detection circuit operates normally. If the light emitting diode LE does not emit light, there must be an error in the modulation detection circuit 103.

When the test switch SW2 is turned off, the negative triggered one-shot $OHS_1$ produces a one-shot pulse and the transistor $Tr_{17}$ is turned on through the OR gate $OR_1$ so that the charge stored in the capacitor $C_1$ is cleared and the power to the drive circuit for the laser diode $LD_1$ is again supplied.

According to the present embodiment, a very stable modulated light is emitted in the normal operation while the drive state of the laser diode is continuously monitored. Thus, if the abnormal state of the modulation occurs, the drive circuit for the laser is instantly blocked so that the safety of the irradiated object and the drive circuit is secured.

In the above embodiment, the drive power supply control circuit 104 and the alarm circuit 105 are activated when light is continuously emitted for a time period corresponding to 0.75 cycle of the modulation period of the laser diode (see $t_2$ in FIG. 3), although the timing for activating the circuits 104 and 105 can be appropriately shifted by changing the resistances of the resistors $R_{20}$ and $R_{21}$.

The alarm is not limited to light emitted by the light emitting diode LE but it may be done by a sound such as an electronic sound.

The duty factor of the oscillator $OSC_1$ may be controlled by the output of the photo-sensor PD (FIG. 5). The oscillation frequency of the oscillator $OSC_1$ is increased when the output of the photo-sensor PD is large and decreased when it is small, and a one-shot circuit which is triggered by the output pulse of the oscillator $OSC_1$ is provided to control the turn-on and turn-off of the transistor $Tr_{12}$. When the output from the laser diode $LD_1$ increases, the output from the photo-sensor PD also increases and the frequency of the oscillator $OSC_1$ increases. As a result, a duty factor of the transistor $Tr_{12}$ controlled by the one-shot circuit increases while the duty factor of the transistor $Tr_{11}$ decreases. As a result, the amount of the drive current per unit time for the laser diode $LD_1$ reduces and the output of the laser diode LD decreases. Conversely, when the output of the laser diode LD decreases, the frequency of the oscillator decreases, the duty factor of the transistor $Tr_{12}$ decreases and the duty factor of the transistor $Tr_{11}$ increases. As a result, the drive current per unit time for the laser diode $LD_1$ increases and the output of the laser diode $LD_1$ increases. By controlling the output of the oscillator $OSC_1$ by the output of the photo-sensor PD, the variation of the output of the laser diode LD is kept within a predetermined range and the range finding is attained within that variation range.

Figures 8, 8A:
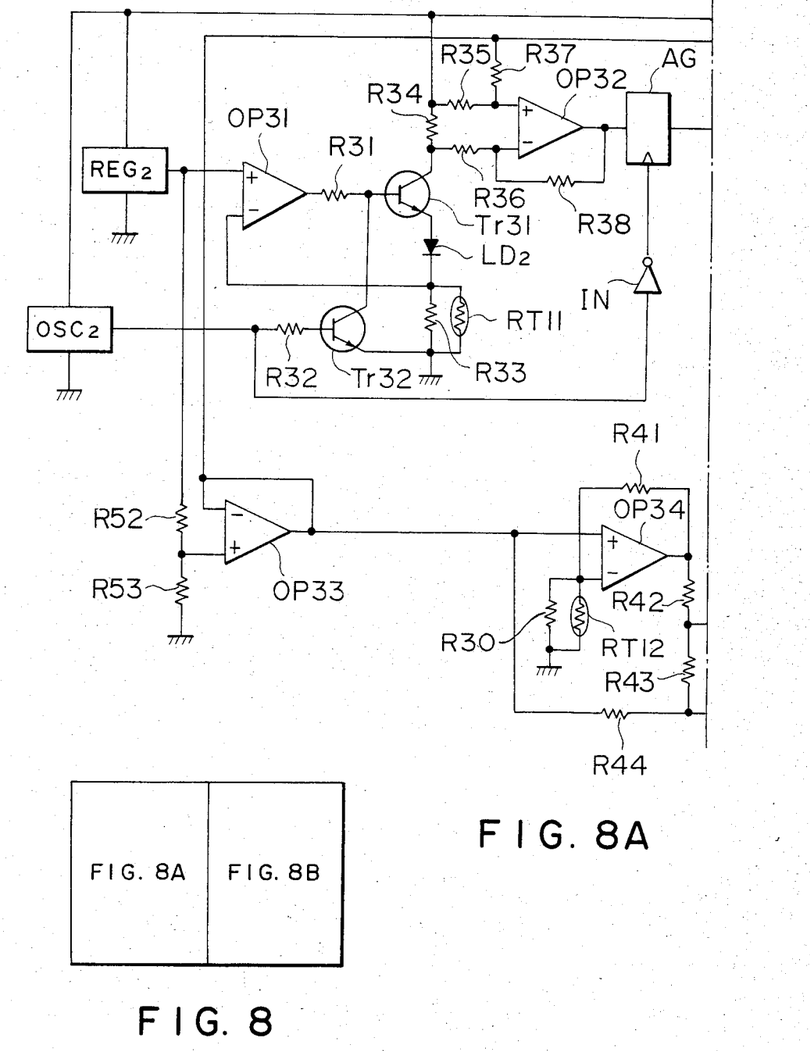
Figure 8B:
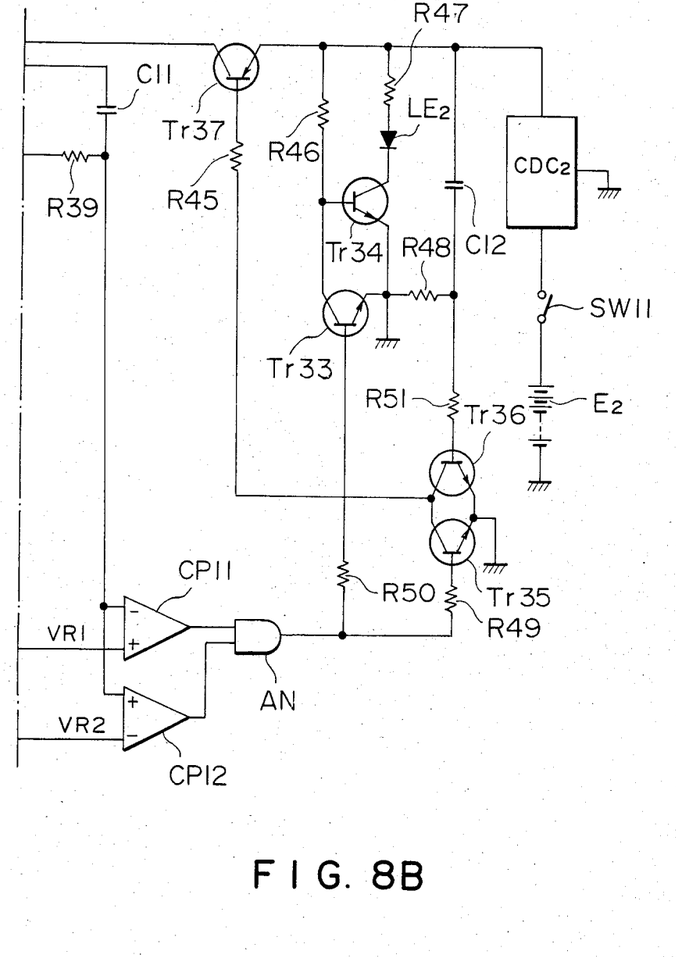

FIG. 8 shows a modification of FIG. 6. $REG_2$ denotes a regulated power supply, $OSC_2$ denotes an oscillator, $OP_{31}$-$OP_{34}$ denote operational amplifiers, $R_{31}$-$R_{53}$ denote resistors, $Tr_{31}$-$Tr_{37}$ denote transistors, $RT_{11}$ and $RT_{12}$ denote thermistors, $C_{11}$ and $C_{12}$ denote capacitors, $LD_2$ denotes a semiconductor laser, AG denotes an analog gate, IN denotes an inverter, $CP_{11}$ and $CP_{12}$ denote comparators, AN denotes an AND gate, $LE_2$ denotes a light emitting diode, $CDC_2$ denotes a step-up DC-DC converter, $E_2$ denotes a power supply battery and SW11 denotes a power switch.

The operation of the above circuit is now explained.

When the power switch SW11 is turned on, the circuit comprising the capacitor $C_{12}$, the resistors $R_{48}$ and $R_{51}$ and the transistor $Tr_{36}$ starts the drive circuit for the semiconductor laser $LD_2$. A fixed voltage from the regulated power supply $REG_2$ is applied to the non-inverting input terminal of the operational amplifier $OP_{31}$, and the feedback circuit comprising the resistor $R_{31}$, the transistor $Tr_{31}$ and the semiconductor laser $LD_2$ is connected between the inverting input terminal of the operational amplifier $OP_{31}$ and the output terminal thereof. Thus, the potentials at the input terminals are substantially equal. Accordingly, the drive current (forward current) of the semiconductor laser $LD_2$ is controlled by a combined resistance of the resistor $R_{33}$, and the temperature compensation thermistor $RT_{31}$ for the semiconductor laser $LD_2$, in accordance with the surrounding temperature.

The conduction of the transistor $Tr_{31}$ is controlled by the modulator comprising the oscillator $OSC_2$, the resistor $R_{32}$ and the transistor $Tr_{32}$. While the modulator and the transistor $Tr_{31}$ operate normally the semiconductor laser $LD_2$ is modulated and driven so that it continuously emits light in synchronism with the output pulse of the oscillator $OSC_2$. When the output of the oscillator $OSC_2$ is high, the transistor $Tr_{32}$ is on and the transistor $Tr_{31}$ is off, and the semiconductor laser $LD_2$ does not emit light, but when the output of the oscillator $OSC_2$ is high, the transistor $Tr_{32}$ is off and the transistor $Tr_{31}$ is on, and the semiconductor laser $LD_2$ emits light.

The drive current to the semiconductor laser $LD_2$ is converted to a voltage by the resistor $R_{34}$ and it is detected by a differential amplifier comprising the resistors $R_{35}$-$R_{38}$ and the operational amplifier $OP_{32}$. The output of the differential amplifier is detected and held by a low-pass filter circuit comprising the resistor $R_{39}$ and the capacitor $C_{11}$, through the analog gate AG which opens the gate when an output of the inverter IN is high and closes the gate when it is low. The output of the low-pass filter circuit is supplied to the inverting input terminal of the comparator $CP_{11}$ and the non-inverting input terminal of the comparator $CP_{12}$. The voltage of the regulated power supply $REG_2$ is divided by the resistors $R_{52}$ and $R_{53}$ and the divided voltage is applied to the non-inverting input terminal of the operational amplifier $OP_{34}$ through the buffer $OP_{33}$. The resistor $R_{40}$ and the thermistor $RT_{12}$ having the same characteristics as the resistor $R_{33}$ and the thermistor $RT_{11}$ are connected to the inverting input terminal of the operational amplifier $OP_{34}$, and the voltage corresponding to the forward current of the semiconductor laser $LD_2$ to be regulated for the surrounding temperature through the feedback resistor $R_{41}$ is produced at the output of the operational amplifier $OP_{34}$. This output is divided by the resistors $R_{42}$, $R_{43}$ and $R_{44}$ to produce an upper limit reference voltage $VR_1$ and a lower limit reference voltage $VR_2$ corresponding to the forward current to be regulated for the surrounding temperature. Those voltages are applied to the non-inverting input terminal of the comparator $CP_{11}$ and the inverting input terminal of the comparator $CP_{11}$ and the inverting input terminal of the comparator $CP_{12}$. When the voltage corresponding to the forward current of the semiconductor laser LD detected through the resistor $R_{34}$ is between the reference voltages $VR_1$ and $VR_2$, the outputs of the comparators $CP_{11}$ and $CP_{12}$ are high and the output of the AND gate AN is high. Accordingly, the transistor $Tr_{35}$ is turned on, the transistor $Tr_{37}$ is turned on and the drive circuit to the semiconductor laser $LD_2$ is activated. Since the transistor $Tr_{33}$ is also turned on, the transistor $Tr_{34}$ is turned off and the alarm light emitting diode $LE_2$ does not emit the light.

If an excess drive current flows into the semiconductor laser $LD_2$ by a failure of the thermistor $RT_{11}$ or the transistor $Tr_{31}$, an excess laser beam is irradiated and a human body or other object may be harmed. Under such a situation, the voltage detected through the resistor $R_{34}$ exceeds the upper limit reference voltage $VR_1$. Thus, the output of the comparator $CP_{11}$ changes to the low level and the output of the AND gate AN changes to the low level. As a result, the transistor $Tr_{37}$ is turned off and the supply to the drive circuit for the semiconductor laser $LD_2$ is instantly blocked. Since the transistor $Tr_{33}$ is turned off, the transistor $Tr_{34}$ is turned on and the alarm light emitting diode LE emits light to indicate the abnormal condition to a user.

In the present embodiment, when the voltage detected through the resistor $R_{34}$ is lower than the lower limit reference voltage $VR_2$, the output of the comparator $CP_{12}$ is also changed and the supply to the semiconductor laser $LD_2$ is blocked and the alarm is indicated.

In accordance with the present embodiment, since the drive state of the semiconductor laser is continuously monitored, if the abnormal condition occurs in the drive circuit, the supply to the semiconductor laser is instantly blocked or the alarm is issued so that harm to the human body is prevented. In addition, secondary trouble due to the continuous operation of the laser drive circuit in the abnormal condition is prevented.

The alarm is not limited to the light emitted by the light emitting diode LE but it may be done by a sound such as an electronic sound.

The duty factor of the oscillator $OSC_2$ may be controlled by the output of the photo-sensor PD (FIG. 5). The oscillation frequency of the oscillator $OSC_2$ is increased when the output of the photo-sensor PD is large and decreased when it is small, and a one-shot circuit which is triggered by the output pulse of the oscillator $OSC_2$ is provided to control the turn-on and turn-off of the transistor $Tr_{32}$. When the object is at a short distance and the light reflected from the object is strong, the output from the photo-sensor PD also increases and the frequency of the oscillator $OSC_2$ increases. As a result, a duty factor of the transistor $Tr_{32}$ controlled by the one-shot circuit increases while the duty factor of the transistor $Tr_{31}$ decreases. As a result, the amount of the drive current per unit time for the laser diode $LD_2$ reduces and the output of the laser diode $LD_2$ decreases. Conversely, when the object is at a distant point and the light reflected from the object is weak, the frequency of the oscillator decreases, the duty factor of the transistor $Tr_{32}$ decreases and the duty factor of the transistor $Tr_{31}$ increases. As a result, the drive current per unit time for the laser diode $LD_2$ increases and the output of the laser diode $LD_2$ increases. By controlling the output of the oscillator $OSC_2$ by the output of the photo-sensor PD, the variation of the output of the laser diode LD is kept within a predetermined range and the range finding is attained within that variation range.

What I claim is:

1. A semiconductor laser driving circuit comprising:
   (a) a semiconductor laser having two terminals;
   (b) a transistor having a first terminal connected to one terminal of said laser, a second terminal arranged for connection to an electric power source and a control terminal;
   (c) an operational amplifier having one input terminal for accepting a reference voltage and another input terminal connected to the other terminal of said laser, an output of said operational amplifier being connected to said control terminal of said transistor;
   (d) a temperature compensation resistance circuit connected to a junction of said other terminal of said laser and said other input terminal of said operational amplifier; and
   (e) an adjusting resistance connected in parallel with said temperature compensation resistance circuit.

2. A semiconductor laser driving circuit according to claim 1, wherein said temperature compensation resistance circuit includes a temperature compensation resistance and a temperature-characteristic-adjusting variable resistance connected in series.

3. A semiconductor laser driving circuit comprising:
   (a) a semiconductor laser having two terminals;
   (b) a transistor having a first terminal connected to one terminal of said laser, a second terminal arranged for connection to an electric power source and a control terminal;
   (c) a first operational amplifier having one input terminal for accepting a reference voltage and another input terminal connected to the other terminal of said laser, an output of said first operational amplifier being connected to said control terminal of said transistor; and
   (d) a reference voltage circuit for supplying the reference voltage to said one input terminal of said first operational amplifier, said reference voltage circuit including:
      (1) a second operational amplifier having one input terminal for accepting a regulated voltage, another input terminal and an output supplied as the reference voltage, the output of said second operational amplifier being connected to said other input terminal thereof through impedance means;

(2) a temperature compensation resistance circuit connected to a junction of said other input terminal of said second operational amplifier and said impedance means; and (3) an adjusting resistance connected in parallel with said temperature compensation resistance circuit.

4. A semiconductor laser driving circuit according to claim 3, wherein said temperature compensation resistance circuit includes a temperature compensation resistance and a temperature-characteristic-adjusting variable resistance connected in series.

5. A semiconductor laser driving circuit comprising:
(a) a semiconductor laser having two terminals;
(b) a transistor having a first terminal connected to one terminal of said laser, a second terminal arranged for connection to an electric power source and a control terminal;

(c) an operational amplifier having one input terminal for accepting a reference voltage and another input terminal connected to the other terminal of said laser, an output of said operational amplifier being connected to said control terminal of said transistor;

(d) a resistance connected to a junction of said other terminal of said laser and said other input terminal of said operational amplifier; and (e) a reference voltage circuit for supplying the reference voltage to said one input terminal of said operational amplifier, said reference voltage circuit including a temperature compensation resistance having a group of temperature compensation resistances and an adjusting resistance connected in parallel with said temperature compensation resistance.

* * * * *